United States Patent
Amemiya

(10) Patent No.: US 7,465,936 B2
(45) Date of Patent: Dec. 16, 2008

(54) MEASURING METHOD, EXPOSURE APPARATUS, AND DEVICE MANUFACTURING METHOD

(75) Inventor: Mitsuaki Amemiya, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 373 days.

(21) Appl. No.: 11/359,303

(22) Filed: Feb. 21, 2006

(65) Prior Publication Data

US 2006/0186352 A1    Aug. 24, 2006

(30) Foreign Application Priority Data

Feb. 21, 2005    (JP)    ............... 2005-043477

(51) Int. Cl.
*G01T 1/16* (2006.01)
(52) U.S. Cl. .................................. 250/374
(58) Field of Classification Search .............. 250/374
See application file for complete search history.

(56) References Cited

U.S. PATENT DOCUMENTS

| | | | | |
|---|---|---|---|---|
| 5,319,695 | A * | 6/1994 | Itoh et al. ................. 378/84 |
| 6,603,533 | B2 * | 8/2003 | Go .......................... 355/71 |
| 6,710,351 | B2 * | 3/2004 | Berger ..................... 250/372 |
| 6,781,135 | B2 * | 8/2004 | Berger ..................... 250/372 |
| 7,202,939 | B2 * | 4/2007 | Gui et al. ................. 355/69 |
| 2003/0052275 | A1 * | 3/2003 | Berger ..................... 250/372 |
| 2005/0045829 | A1 | 3/2005 | Ito et al. |
| 2005/0173647 | A1 * | 8/2005 | Bakker ..................... 250/372 |
| 2006/0119828 | A1 * | 6/2006 | Ito et al. ................... 355/69 |

FOREIGN PATENT DOCUMENTS

JP    2004-303760    10/2004

* cited by examiner

*Primary Examiner*—David P. Porta
*Assistant Examiner*—David S Baker
(74) *Attorney, Agent, or Firm*—Morgan & Finnegan, L.L.P.

(57) ABSTRACT

A measuring method that utilizes a bandpass filter and a measurement apparatus to measure an intensity of light having a predetermined wavelength among lights emitted from a light source, the bandpass filter transmitting the light having the predetermined wavelength, the measurement apparatus measuring an absolute intensity of an incident light includes the steps of measuring an output of the measurement apparatus continuously, stopping or starting an emission of the light source in the measuring step, calculating a first extreme value $t \rightarrow t_0 - 0$ and a second extreme value $t \rightarrow t_0 + 0$ in the output of the measurement apparatus at time $t_0$ where $t$ is time in the measuring step, and $t_0$ is time when the emission of the light source stops; and calculating a difference between the first extreme value $t \rightarrow t_0 - 0$ and the second extreme value $t \rightarrow t_0 + 0$.

6 Claims, 11 Drawing Sheets

MEASURING METHOD, EXPOSURE APPARATUS, AND DEVICE MANUFACTURING METHOD

BACKGROUND OF THE INVENTION

The present invention relates generally to a measuring method, and more particularly to a measuring method that measures the intensity of the light with a target wavelength using a measurement apparatus that can measure the absolute intensity of the incident light, such as a calorimeter. The present invention is suitable, for example, for an exposure apparatus that utilizes the extreme ultraviolet ("EUV") as a light source.

A conventional reduction projection exposure apparatus uses a projection optical system to project and transfer a circuit pattern of a mask or a reticle onto a wafer, etc., in manufacturing a semiconductor device, such as a semiconductor memory and a logic circuit, in the photolithography technology.

The minimum critical dimension ("CD") transferable by the reduction projection exposure apparatus or a resolution is proportionate to a wavelength of the exposure light, and inversely proportionate to the numerical aperture ("NA") of the projection optical system. The shorter the wavelength is, the better the resolution is. Accordingly, use of the exposure light having a shorter wavelength is promoted with recent demands for the finer processing to the semiconductor devices, and ultraviolet ("UV") light having a smaller wavelength has been used from a KrF excimer laser (with a wavelength of approximately 248 nm) to an ArF excimer laser (with a wavelength of approximately 193 nm).

However, the lithography using the UV light has the limit to satisfy the rapidly promoting fine processing of a semiconductor device. Accordingly, a reduction projection exposure apparatus using EUV light with a wavelength of 10 to 15 nm shorter than that of the UV light (referred to as an "EUV exposure apparatus" hereinafter) has been developed to efficiently transfer a very fine circuit pattern of 0.1 µm or less. The EUV exposure apparatus uses, as a light source, a laser plasma light source and a discharge plasma light source. The laser plasma light source irradiates the laser light onto a target and captures the EUV light from the generated plasma. The discharge plasma light source pinches or converges the plasma generated from the discharge of an electrode under a low-pressure gas atmosphere, and captures the EUV light from the pinched plasma.

Exposure dose control is important for the exposure apparatus, because the transferred pattern's CD depends upon the exposure dose. The exposure dose control relies upon an exposure time period based on the pre-measured exposure dose, or an integral exposure dose based on the exposure dose by taking and measuring part of the exposure light with a photo-detector. The photo-detector that measures the exposure dose is, for example, a photodiode that provides a quick measurement and has high sensitivity. Nevertheless, the photodiode cannot problematically measure an absolute value, or maintain the sensitivity. Hence, a calorimeter that can measure the absolute value is required to regularly calibrate the sensitivity of the photodiode. For this purpose, the exposure apparatus includes a photodiode that always measures the exposure dose, and the calorimeter that calibrates the photodiode.

In measuring the exposure dose in the EUV exposure apparatus, it is proposed to arrange a zirconium (Zr) filter or another filter for shielding the visible light in front of a photodiode and to receive the EUV light reflected on the multilayer coating. See, for example, Japanese Patent Application, Publication No. 2004-303760. The multilayer coating reflects both the far-UV light and the visible light as well as the EUV light having a wavelength near 13.5 nm as the exposure light, and the filter shields both the far-UV light and visible light. While the infrared ray is incident upon the photodiode together with the EUV light from the filter, the photodiode is not sensitive to the infrared ray and can measure the intensity of only the EUV light. The EUV light has photonic energy 100 times as high as the UV light, and the photodiode that measures the EUV light is highly likely to deteriorate.

However, the EUV exposure light cannot use the calorimeter as a detector for calibrating the photodiode or as a detector for measuring the exposure dose, because the calorimeter has the same sensitivity to all lights with various wavelengths and cannot separate the EUV light having a wavelength, for example, near 13.5 nm as the exposure light from other unnecessary lights.

Assume, for example, use of a calorimeter that places a filter in front of it. If only the EUV light is incident upon the calorimeter, the energy of the EUV light at a measured position incident upon the filter is obtained by dividing the measured energy by the transmittance of the filter to the EUV light. However, in fact, the infrared ray emitted from the filter is incident in addition to the EUV light upon the calorimeter. As the filter has such extremely low transmittance to the EUV light that it should be made as thin as possible. For example, even the Zr filter that has high transmittance to the EUV light allows only 50% of the EUV light to pass through it when it is 0.2 µm thick. The absorbed energy cannot escape through heat conduction. In addition, the filter cannot emit the heat to the air since it is placed in vacuum to reduce the absorption of the EUV light in the gas. As a consequence, the energy absorbed in the filter is radiated as the infrared ray and incident upon the calorimeter. The infrared ray from the filter is non-negligible to the EUV light and its intensity amounts to that of the EUV light, causing a significant error, and rendering the calorimeter unusable.

Moreover, the calorimeter is subject to the environmental temperature variance. For example, when the calorimeter is placed in vacuum, the heat incident upon the surrounding components cannot escape, causing the temperature rises in the surrounding members, and the output offset changes. As a result, the output may not become 0 even when the emission of the EUV light stops. The measurement offset varies with time, and an unknown offset amount causes a measurement error.

BRIEF SUMMARY OF THE INVENTION

The present invention is directed to a measuring method that can precisely measure the absolute intensity of the light having the target wavelength, such as the EUV light, even when the measurement apparatus receives unnecessary lights and the offset varies.

A measuring method according to one aspect of the present invention that utilizes a bandpass filter and a measurement apparatus to measure an intensity of light having a predetermined wavelength among lights emitted from a light source, the bandpass filter transmitting the light having the predetermined wavelength, the measurement apparatus measuring an absolute intensity of an incident light includes the steps of measuring an output of the measurement apparatus continuously, stopping or starting an emission of the light source in the measuring step, calculating a first extreme value t→$t_0$−0 and a second extreme value t→$t_0$+0 in the output of the measurement apparatus at time $t_0$ where t is time in the measuring step, and $t_0$ is time when the emission of the light source stops; and calculating a difference between the first extreme value t→$t_0$−0 and the second extreme value t→$t_0$+0.

An exposure apparatus according to another aspect of the present invention for illuminating a pattern of a mask with light from a light source and for exposing the pattern onto a plate includes a photodiode for measuring an exposure dose on the plate, a controller for controlling the exposure dose based on a measurement result of the photodiode, a calibrator for calibrating the photodiode, a measurement apparatus for measuring an absolute intensity of an incident light via a bandpass filter, and an operating part for executing the above measuring method.

A device manufacturing method includes the steps of exposing a plate using the above exposure apparatus, and developing the plate that has been exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
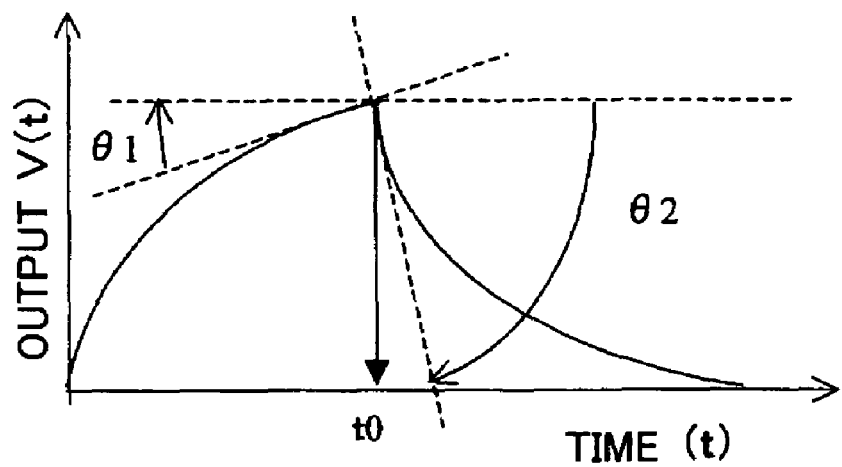
FIG. 1 is a graph showing an output of the calorimeter that receives both the EUV light and non-EUV light.

Referring now to the accompanying drawings, a description will be given of a measuring method according to one aspect of the present invention. In each figure, like elements are designated by the same reference numerals, and a duplicate description thereof will be omitted.

Figure 12:
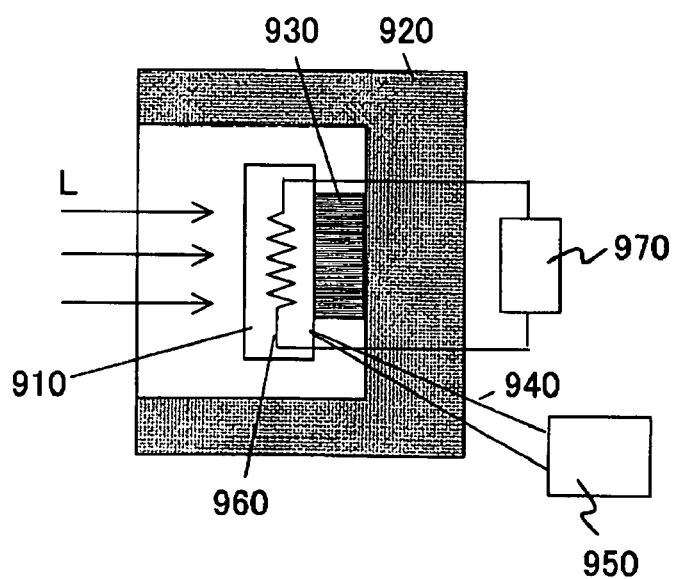
FIG. 12 is a schematic block diagram showing a structure of the calorimeter.

Before the inventive principle is discussed, the general structure and principle of the calorimeter will be discussed below. FIG. 12 is a schematic block diagram of the structure of the calorimeter. The calorimeter includes, as shown in FIG. 12, a light receiving part 910, a case 920, a heat conductor 930, a temperature measuring unit 940, a voltmeter 950, a heater 960, and a power source 970.

The light receiving part 910 receives all lights L incident upon the calorimeter. The heat absorbed at the light receiving part 910 is emitted to the case 920 via the heat conductor 930. The case 920 has a warm bath structure in which the temperature does not rise even when the heat flows in it from the light receiving part 910. As the light receiving part 910 absorbs the heat, the temperature rises. The temperature measuring unit 940, such as a Peltier element and a thermocouple, is attached to the light receiving part 910, and the calorimeter can calculate the energy of the incident light by measuring the output at the voltmeter 950.

Equation 1 below gives a time differentiation to a temperature rise value ΔT of the light receiving part 910 of the calorimeter, where Cp is a heat capacity of the light receiving part 910, and $q_{-in}$ and $q_{-out}$ are energies of the incident light on and exit light from the light receiving part 910. Assume that $q_{-in}$ is constant.

$$d\Delta T/dt \times Cp = q_{-in} - q_{-out} \qquad [\text{EQUATION 1}]$$

Equation 2 below provides a relationship between an output V of the calorimeter and the temperature rise value ΔT. When the heat escapes to the outside through the heat conduction, the energy $q_{-out}$ emitted form the light receiving part 910 has a proportional relationship with the output V of the calorimeter, and satisfies Equation 3 below, where A is a proportionality factor, and A×C1 is a quantity of heat flowing out per unit temperature difference, which is a value of the thermal conductivity multiplied by a length.

$$V = C1 \times \Delta T \qquad [\text{EQUATION 2}]$$

$$q_{-out} = A \times V \qquad [\text{EQUATION 3}]$$

A differential equation is given by Equation 4 below where C2=Cp/C1.

$$dV/dt \times C2 = q_{-in} - A \times V(t) \qquad [\text{EQUATION 4}]$$

Equation 5 below is obtained by solving the differential equation given by Equation 4, where τ is a relaxation time, as given by Equation 6 below, and C3 is integration constant, determined by the initial condition:

$$V = C3 \times \exp(-t/\tau) + q_{-in}/A \qquad [\text{EQUATION 5}]$$

$$\tau = C2/A \qquad [\text{EQUATION 6}]$$

When ΔT=0 at τ=0, C3 becomes −$q_{-in}$/A, and the output V of the calorimeter is given by Equation 7 below:

$$V = q_{-in}/A \times (1 - \exp(-t/\tau)) \qquad [\text{EQUATION 7}]$$

In general, the light receiving part 910 of the calorimeter has a calibration heater 960, so as to calibrate the calorimeter by supplying the power to the heater 960 via the power source 970, and by calculating the relationship between the supplied energy and the output. The proportionality factor A in Equation 7 is given by Equation 8 below, where Po is power supplied to the heater 960, and Vo is a saturation output at that time:

$$A = Po/Vo \quad \text{[EQUATION 8]}$$

Equation 9 below is led from Equation 7 and the output V when t→∞, and the energy (intensity) $q_{-in}$ of the incident light upon the light receiving part 910 can be calculated. The measuring time period can be shortened by predicting the saturation output from Equation 7.

$$q_{-in} = Po/Vo \times V = A \times V \quad \text{[EQUATION 9]}$$

Suppose that light other than the target EUV light (non-EUV light) is incident upon the light receiving part 910, or the intensity $q_{-in}$ of the incident light upon the light receiving part 910 contains the intensity $q_{-euv}$ of the EUV light and the intensity $q_{-etc}$ of the non-EUV light (as indicated in Equation 10 below):

$$q_{-in} = q_{-euv} + q_{-etc} \quad \text{[EQUATION 10]}$$

The intensity $q_{-etc}$ of the non-EUV light contains that of the infrared ray from the filter and the external world's changes, such as the chamber's temperature change. Since the non-EUV light trace the same path and enter the calorimeter at the same time as the EUV light, it is not separable from the EUV light. In addition, when the temperature of the case 920 changes in the calorimeter, the output of the calorimeter contains a variable offset.

Figure 15:
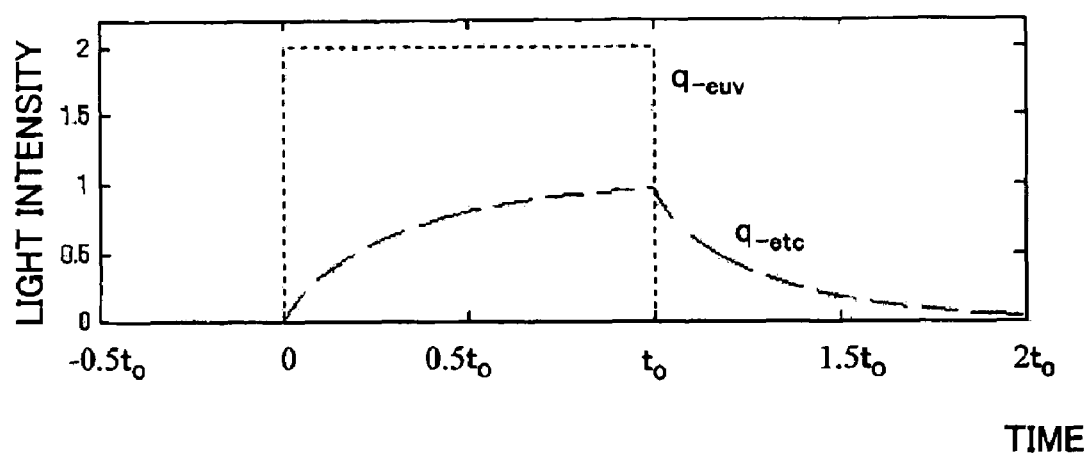
FIG. 15 is a graph showing the light intensity incident upon the calorimeter where the light source starts an emission at time 0 and stops the emission at time $t_0$.
Figure 16:
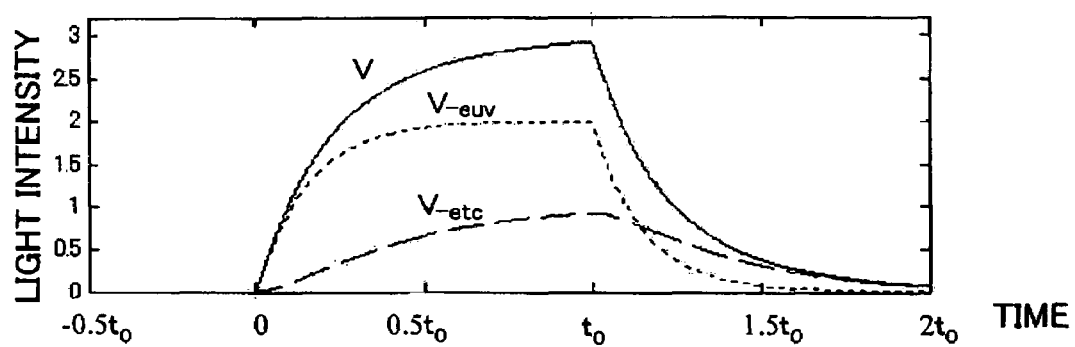
FIG. 16 is a graph of an output of a calorimeter when two time-variable lights are incident upon the calorimeter.

For example, FIG. 15 shows a one-dotted line and a broken line that correspond to the light intensities $q_{-euv}$ and $q_{-etc}$ incident upon the calorimeters when the light source starts an emission at time 0 and stops it at time $t_0$. $q_{-euv}$ shows a constant intensity between time 0 and time $t_0$, whereas the intensity $q_{-euv}$ of the infrared ray increases from time $t_0$, has a peak at time $t_0$, and attenuates after time $t_0$. When two time-variable lights ($q_{-euv}$ and $q_{-etc}$) enter the calorimeter, its output V becomes as shown in FIG. 16. FIG. 16 shows a one-dotted line and a broken line that correspond to the output increase amounts $V_{-euv}$ and $V_{-etc}$ of $q_{-euv}$ and $q_{-etc}$. A solid line is the output V of the calorimeter and $V = V_{-euv} + V_{-euv}$. The actual measurement provides the output V of the calorimeter. Originally, an error is $V - V_{-euv}$.

In measuring the intensity of the EUV light, use of the calorimeter is difficult or would remarkably deteriorate the measuring accuracy.

This embodiment attempts to provide a measurement method that can precisely measure the intensity of the EUV light even when the non-EUV light enters the calorimeter and there is a variable offset. A description will now be given of the principle of the inventive measuring method. This embodiment contemplates the EUV light and the light other than the EUV light enter the calorimeter (as indicated by Equation 10). This embodiment attempts to separate the intensity $q_{-etc}$ of the non-EUV light from the intensity $q_{-in}$ of the incident light, and calculate the intensity $q_{-euv}$ of the EUV light. Equation 2 is expressed by Equation 11, where $q_{-in}(t) = q_{-euv} + q_{-etc}(t)$:

$$dV/dt \times C2 = q_{-in} - q_{-out} = q_{-euv} + q_{-etc} - q_{-out} \quad \text{[EQUATION 11]}$$

When the continuous EUV light emission stops at time $t = t_0$ at which the intensity $q_{-in}$ of the incident light upon the calorimeter is measured, the intensity $q_{-in}$ of the incident light is expressed as in Equation 12 below:

$$t < t_0, q_{-in}(t) = q_{-euv} + q_{-etc}(t)$$

$$t > t_0, q_{-in}(t) = q_{-euv} \quad \text{[EQUATION 12]}$$

Therefore, Equation 11 turns to Equation 13 below that changes before and after $t = t_0$. $q_{-etc}$ and $q_{-out}$ are time dependent functions, and $q_{-etc}$ is a constant having a constant value when $t < t_0$. The output V(t) of the calorimeter becomes a curve shown by a solid line in FIG. 1. Here, FIG. 1 is a graph of the output of the calorimeter when the EUV light and the non-EUV light enter the calorimeter, where an ordinate axis is an output V(t) of the calorimeter, and the abscissa axis is time t.

$$dV(t)/dt \times C2 = q_{-euv} + q_{-etc}(t) - q_{-out}(t) \quad (t < t_0)$$

$$dV(t)/dt \times C2 = q_{-etc}(t) - q_{-out}(t) \quad (t > t_0) \quad \text{[EQUATION 13]}$$

As shown in Equation 14, the extreme values of both sides in Equation 13 are calculated at $t = t_0$.

$$\lim_{t \to t_0 - 0} \left(\frac{dV}{dt}\right) \times C2 = \lim_{t \to t_0 - 0} (q_{-euv} + q_{-etc}(t) - q_{-out}(t)) \quad \text{[EQUATION 14]}$$

$$\lim_{t \to t_0 + 0} \left(\frac{dV}{dt}\right) \times C2 = \lim_{t \to t_0 + 0} (q_{-etc}(t) - q_{-out}(t))$$

$q_{-etc}$ and $q_{-out}$ are state quantities, which are determined by temperatures of the light receiving part in the calorimeter and the filter, and are unique to time t. The extreme values of $q_{-etc}$ and $q_{-out}$ at $t = t_0$ do not depend upon the (positive and negative) directions of the time t and are expressed by Equation 15 below:

$$\lim_{t \to t_0 + 0}(q_{-etc}(t)) = \lim_{t \to t_0 - 0}(q_{-etc}(t)) \quad \text{[EQUATION 15]}$$

$$\lim_{t \to t_0 + 0}(q_{-out}(t)) = \lim_{t \to t_0 - 0}(q_{-out}(t))$$

On the contrary, $q_{-euv}$ is a light intensity of the light source, and discontinues at time $t_0$. Since the output V(t) of the calorimeter that contains $q_{-euv}$ cannot be differentiated at $t = t_0$, the extreme value of dV(t)/dt at $t = t_0$ differs according to the (positive or negative) direction of time t. Accordingly, the intensity $q_{-etc}$ of the EUV light can be obtained, as shown by Equation 16 below, by calculating a difference between both equations in Equation 14.

$$q_{-euv} = \left(\lim_{t \to t_0 - 0}\left(\frac{dV}{dt}\right) - \lim_{t \to t_0 + 0}\left(\frac{dV}{dt}\right)\right) \times C2 \quad \text{[EQUATION 16]}$$

Referring to FIG. 1, dV/dt is a local inclination (tangent) of a curve, and the intensity $q_{-etc}$ of the EUV light is also expressed by Equation 17 below:

$$q_{-euv} = (\tan \theta_1 - \tan \theta_2) \times C2 \quad \text{[EQUATION 17]}$$

Therefore, once C2 is determined, the intensity $q_{-etc}$ of the EUV light is determined. A conceivable method of determining C2 uses the relaxation time τ. More specifically, C2 is defined by Equation 18 below from Equations 6 and 8:

$$C2 = \tau \times Po/Vo \quad \text{[EQUATION 18]}$$

A description will now be given of a calculation of the relaxation time τ. The relaxation time τ can be calculated from a time variance of the output V of the calorimeter in supplying the power to the heater 960 for calibration. As described above, the time variance of the output V of the calorimeter is expressed by Equation 4. Equation 19 below is obtained by substituting Equation 6 for Equation 4:

$$dV(t)/dt = -V(t)/\tau + q_{-in}/A/\tau \quad \text{[EQUATION 19]}$$

In calibrating the calorimeter, the power is supplied to the heater 960, and the output V is measured as a function of time t. A graph between the output V and the time variance dV(t)/dt of the output V is sought based on the measurement result, and approximated as a linear function using the linear least squares method. Then, the relaxation time $\tau$ is calculated from the approximation coefficient.

The approximation time $\tau$ can also be obtained by integrating both sides of Equation 7. When Equation 7 is integrated with an integration segment between 0 and tm, Equation 20 below is given:

$$\int_0^{tm} V(t)dt = q_{-in}/A \times \int_0^{tm}(1_{-\exp}(-t/\tau))dt \quad \text{[EQUATION 20]}$$
$$= q_{-in}/A \times (tm + \tau \times \exp(-tm/\tau) - \tau)$$

When $tm > 5 \times \tau$, $\exp(-tm/\tau) = 0.0067$. From Equation 8 at the calibration time of the calorimeter, $A = Po/Vo$ and Equation 21 below is met from $q_{in} = Po$:

$$\int_0^{tm} V(t)dt \approx Vo \times (tm - \tau) \quad \text{[EQUATION 21]}$$

In conclusion, the relaxation time $\tau$ is given by Equation 22 below:

$$\tau \approx tm - \int_0^{tm} V(t)/Vo\, dt \quad \text{[EQUATION 22]}$$

After the relaxation time $\tau$ is calculated, the target intensity $q_{-euv}$ of the EUV light is expressed by Equation 23 below:

$$q_{-euv} = \left(\underset{t \to t_0 - 0}{limit}\left(\frac{dV}{dt}\right) - \underset{t \to t_0 + 0}{limit}\left(\frac{dV}{dt}\right)\right) \times \tau \times \frac{Po}{Vo} \quad \text{[EQUATION 23]}$$

C2 can also be calculated, in calibrating the calorimeter, from the time variance of the output just after the power is supplied to the heater 960 and then a supply of the power to the heater 960 stops after a sufficient time elapses. Equation 24 below is met, where Po is the power supplied to the heater 960, Vo is the saturation output, the power supply stops at time $t_o$, and $q_{-in} = 0$ in Equation 4.

$$\underset{t \to t_0 + 0}{limit}\left(\frac{dV}{dt}\right) \times C2 = -A \times \underset{t \to t_0 + 0}{limit}(V(t)) = -A \times Vo = -Po \quad \text{[EQUATION 24]}$$

Equation 24 uses Equation 8; C2 is given by Equation 25 below:

$$C2 = -\frac{Po}{\underset{t \to t_0 + 0}{limit}}\left(\frac{dV}{dt}\right) \quad \text{[EQUATION 25]}$$

Since the relaxation time $\tau$ and C2 are thus determined, the intensity $q_{-euv}$ of only the EUV light can be calculated from Equation 16 or 23, by measuring dV/dt before and after the emission of the EUV light stops.

Practically, the output V of the calorimeter is measured every a predetermined time interval, and the emission of the EUV light (light source) stops during each measurement. The output of the calorimeter is divided before and after the emission stops, and approximated as a time dependent function to a linear n-th function. The time differentiation to the output of the calorimeter is predicted when the light source stops.

In general, when the emission of the EUV light source starts, it takes a long time $t_0$ obtain the stable emission intensity. When the time period necessary to obtain the stable intensity of the EUV light is much shorter than the relaxation time, the intensity $q_{-euv}$ of the EUV light can also be obtained from the output change of the calorimeter at the emission starting time. Assume that the time at which the light source starts emissions is 0. Then, the intensity $q_{-in}$ of the light incident upon the calorimeter is given by Equation 26 below:

$$t < 0, q_{-in} = q_{-etc}$$
$$t > 0, q_{-in} = q_{-euv} + q_{-etc} \quad \text{[EQUATION 26]}$$

Therefore, similar to the above case where the emission of the EUV light stops, the intensity $q_{-euv}$ of the EUV light can be obtained:

$$q_{-euv} = \left(\underset{t \to +0}{limit}\left(\frac{dV}{dt}\right) - \underset{t \to -0}{limit}\left(\frac{dV}{dt}\right)\right) \times \tau \times \frac{Po}{Vo} \quad \text{[EQUATION 27]}$$

$\tau$ is calculated form the linear coefficient of Equation 19 or Equation 22. Alternatively, it can be calculated from dV/dt just after the light source starts an emission, similar to Equation 25.

While this embodiment describes by way of example of the power supply to the heater 960 for calibration, this calibration may use a reference light source with a known light intensity as the radiation light. A method of calculating C2 is not limited to the above embodiment, and another method may be used.

As discussed above, the inventive measuring method enables the absolute intensity of the EUV light to be precisely measured, even when the non-EUV light is incident upon the calorimeter. Therefore, the deterioration and the intensity variance of the EUV light source that emits the EUV light can be measured and, for example, the maintenance time of the EUV light source can be predicated in the EUV exposure apparatus. In addition, the calorimeter can be used to calibrate the photodiode that measures the exposure dose.

Figure 2:
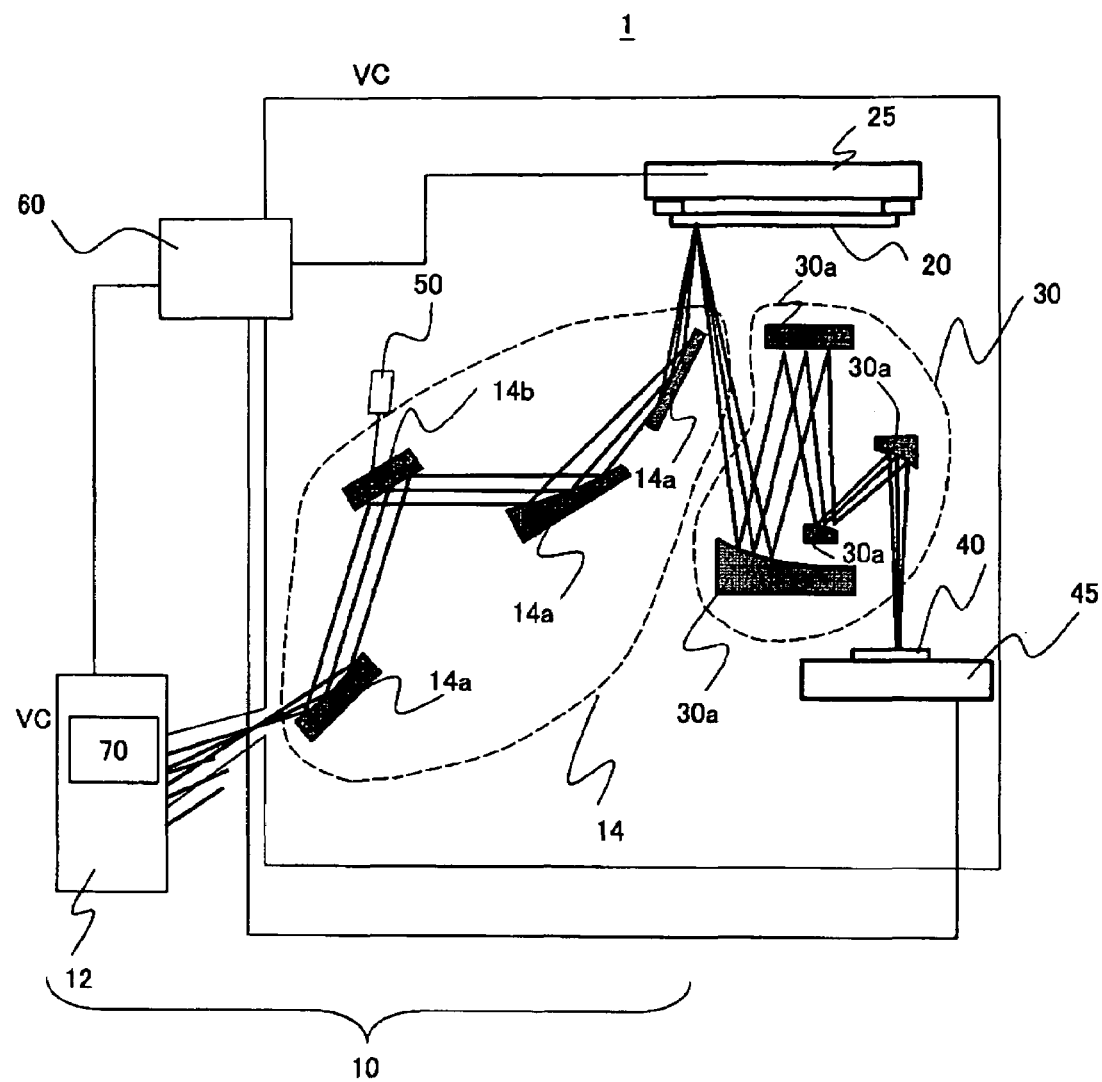
FIG. 2 is a schematic sectional view of a structure of an exposure apparatus according to one aspect of the present invention.

Referring now to FIG. 2, a description will be given of an illustrative exposure apparatus 1 to which the inventive measuring method is applied. Here, FIG. 2 is a schematic sectional view showing a structure of the exposure apparatus 1 according to one aspect of the present invention.

The exposure apparatus 1 uses the EUV light (with a wavelength of, e.g., 13.4 nm) as illumination light for exposure, and exposes a circuit pattern of a mask 20 onto a plate 40, for example, in a step-and-scan manner. However, the inventive exposure apparatus is applicable to the step-and-repeat manner. This exposure apparatus is suitable for a lithography process less than submicron or quarter micron, and the present embodiment exemplifies the step-and-scan exposure apparatus (also referred to as a "scanner"). The "step-and-scan manner," as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 2, the exposure apparatus 1 includes an illumination optical system 10, a reticle stage 25 for supporting the mask 20, a projection optical system 30, a wafer stage 45 for supporting the plate 40, a photodiode 50, a controller 60, and a calibrator 70.

As shown in FIG. 1, at least the optical path through which the EUV light travels or the entire optical system is preferably maintained in a vacuum atmosphere VC, since the EUV light has a low transmittance to the air and causes contaminations in reaction with residue gas components, such as a polymer organic gas.

The illumination apparatus 10 uses the arc-shaped EUV light corresponding to an arc-shaped field in the projection optical system 30 to illuminate the mask 20, and includes an EUV light source 12 and an illumination optical system 14.

The EUV light source 12 uses, for example, a discharge plasma light source and a laser plasma light source. The EUV light source 12 generates plasma, and utilizes the EUV light with a wavelength of about 13 nm emitted from this.

The illumination optical system 14 is an optical system for illuminating the mask 20, and includes mirrors 14a for reflecting the EUV light and an optical integrator 14b. The optical integrator 14b serves to uniformly illuminate the mask 20 at a predetermined NA. The illumination optical system 14 further includes an aperture (or a field stop) 14c (not shown) for restricting the illumination area to the arc shape.

The mask 20 is a reflection reticle, and has a circuit pattern (or image) to be transferred. It is supported and driven by the reticle stage 25. The diffracted light emitted from the mask 20 is projected onto the plate 40 after reflected by the projection optical system 30. The mask 20 and plate 40 are arranged optically conjugate with each other. Since the exposure apparatus 1 of this embodiment is a scanner, the mask 20 and plate 40 are scanned in transferring the mask 20's pattern onto the plate 40.

The reticle stage 25 supports the mask 20 and is connected to a moving mechanism (not shown). The reticle stage 25 may use any structure known in the art. The moving mechanism (not shown) may include a linear motor etc., and drives the reticle stage 25 at least in an X-axis direction, and moves the mask 20. The exposure apparatus 1 assigns the X axis to a scan direction within a plane of the mask 20 or the plate 40, the Y axis perpendicular to the X axis, and the Z axis perpendicular to the mask 20 or the plate 40 surface.

The projection optical system 30 uses plural (multilayer) mirrors 30a to project a reduced size of the mask 20's pattern onto the plate 40 on the image surface. The number of mirrors is about four to six. In order to implement a wide exposure area with the small number of mirrors, the mask 20 and plate 40 are simultaneously scanned to transfer a wide area by using only a fine arc-shaped area or ring field apart from the optical axis by a predetermined distance.

The plate 40 is a wafer in this embodiment, but broadly covers a liquid crystal substrate and other targets to be exposed. A photoresist is applied to the plate 40.

The plate 40 is held onto the wafer stage 45 by a wafer chuck. The wafer stage 45 moves the plate 40, for example, using a linear stage in XYZ-axes directions. The positions of the reticle stage 25 and wafer stage 45 are monitored, for example, by a laser interferometer, and they are driven at a constant speed ratio.

The photodiode 50 measures the exposure dose on the plate 40 during exposure, and sends a signal corresponding to the output to the controller 60. As shown in FIG. 2, the photodiode 50 is arranged in such place between the illumination optical system 14 and the reticle 20 that it does not shield the annular area for illuminating the reticle 20. An opening is pierced in part of the optical integrator 14b, and the photodiode 50 provided behind the opening measures the EUV light that has passed the opening. The calibrator 70 regularly calibrates the sensitivity of the photodiode 50, as will be described later.

The controller 60 includes a CPU and a memory (not shown), and controls the operation of the exposure apparatus 1. The controller 60 of this embodiment controls the exposure dose on the plate 40 based on the measurement result from the photodiode 50. More specifically, in case of the scanner, it exposes by using plural pulses during scanning of each shot, and the photodiode 50 always measures the exposure dose. An output of the EUV light source 12 (for example, the energy per one pulse or oscillation frequency) is adjusted so that the exposure dose in the shot reaches the predetermined value (or the optimal exposure dose determined by the photoresist). The controller 60 is electrically connected to the illumination apparatus 10, (the moving mechanism (not shown) of) the reticle stage 25, (the moving mechanism (not shown) of) the wafer stage 45, and the photodiode 60. The CPU includes any processor irrespective of its name, such as an MPU, and controls an operation of each component. The memory includes a ROM and a RAM, and stores firmware for use with the operations of the exposure apparatus 1.

Figure 3:
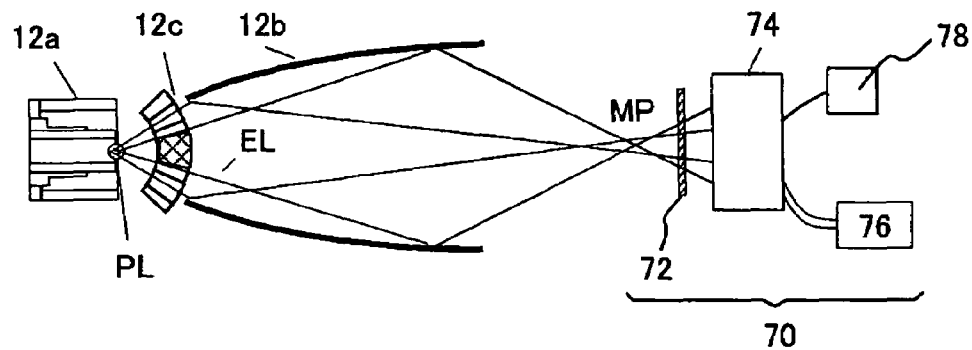
FIG. 3 is a schematic sectional view showing one exemplary structure of a calibrator shown in FIG. 2.

The calibrator 70 serves to calibrate the photodiode 50. The calibrator 70 includes, as shown in FIG. 3, a bandpass filter 72 that transmits the light with a desired wavelength, a calorimeter 74 that detects the light that has passed the bandpass filter 72, a voltmeter 76, and an operating part 78 that executes the inventive measuring method. The calibrator 70 is arranged in the vacuum atmosphere VC similar to the other optical systems. A description will now be given of a specific structure and operation of the calibrator 70, with reference to FIG. 3. This embodiment uses a discharge plasma light source for the EUV light source 12, and the calorimeter 74 has the same basic structure as the calorimeter shown in FIG. 12. FIG. 3 is a schematic sectional view of one exemplary structure of the calibrator 70.

Referring to FIG. 3, when the voltage is applied to the electrode 12a, the plasma PL is generated at the point of the electric tip on which the electric field concentrates, and the light EL is radiated from the plasma PL in $4\pi$ directions. The light EL radiated from the plasma PL is condensed at the intermediate condensing point MP by the condenser mirror 12b, and led to the subsequent illumination optical system 14.

The calorimeter 74 is arranged on the optical path between the intermediate condensing point MP and the illumination optical system 14, and does not shield the optical path during exposure. The voltmeter 76 is connected to an output terminal of the calorimeter 74.

The condenser mirror 12b is a multilayer or oblique incident mirror. The plasma PL and debris disperse from the electrode 12 in addition to the light EL. The debris possesses high energy, and may damage the condenser mirror 12b and the illumination optical system 14, if it collides with them. Accordingly, a debris stopper 12c is arranged between the plasma PL and the condenser mirror 12b so as to shield the debris. The debris stopper 12c includes plural thin plates each formed by cutting part of a cone member having a vertex at the plasma PL, plural other orthogonal thin plates, and gas, such as helium (He), which fills the space in the thin plates. All the plates are parallel to the optical axis and do not shield the light EL radiated from the plasma PL. On the contrary, the debris radiated from the plasma PL changes its trajectory as a result of a collision with the gas molecules, such as He, and collides with the debris stopper 12c. Thereby, the light EL can passes through the debris stopper 12b, whereas the debris is caught by the debris stopper 12 and does not reach the condenser mirror 12b.

The light EL radiated from the plasma PL contains various lights of a wide waveband from X-ray having a wavelength of 1 nm to the infrared ray having a wavelength of 10 μm. When the condenser mirror 12b is an oblique incident mirror, it has a high reflectance in a wide wave range that covers the light having a wavelength of 10 nm to the visible and the infrared rays. Therefore, it reflects the non-EUV light in addition to the exposure light (EUV light).

Figure 4:
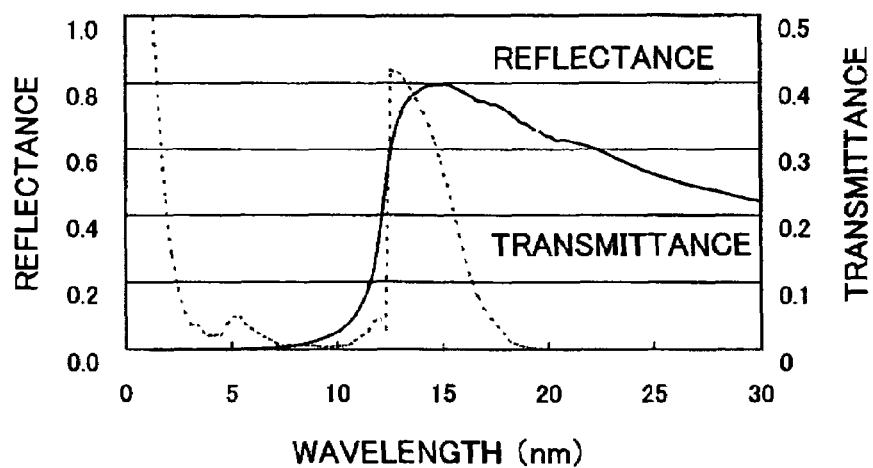
FIG. 4 is a graph showing the reflectance of a condenser mirror and the transmittance of a bandpass filter shown in FIG. 3.

FIG. 4 shows a reflectance of the condenser mirror 12b that is made of molybdenum (Mo), when the light is incident upon it at an inclined angle of 20°. FIG. 4 shows a solid-line graph that indicates the reflectance of the condenser mirror 12b, and a broken-line graph that indicates the transmittance of the bandpass filter 72. The left ordinate axis denotes the reflectance, and right ordinate axis denotes the transmittance. The abscissa axis denotes the wavelength. Referring to FIG. 4, the condenser mirror 12b is an optical system having a comparatively flat spectral reflectance relative to the light having a wavelength of 13.5 nm. The bandpass filter 72 is preferably arranged in front of the calorimeter 74 so as to transmit the necessary exposure light. The bandpass filter 72 that transmits only the EUV light is helpful for the calorimeter 74 to measure the exposure dose of the EUV light as the exposure light.

FIG. 4 shows a broken-line graph that indicates the transmittance of the bandpass filter 72 as a thin film filter made of Mo having a thickness of 0.1 μm and silicon (Si) having a thickness of 0.2 μm. Referring to FIG. 4, the light having a shorter wavelength than 12.5 nm is shielded, which is the Si's absorption end. The bandpass filter 72 transmits the light having a wavelength smaller than 2 nm. The condenser mirror 12b cuts the lights in this wave range. The material of the bandpass filter 72 is not limited to this embodiment, and may be Si, niobium (Nb), Zr, etc. for similar effects.

Figure 5:
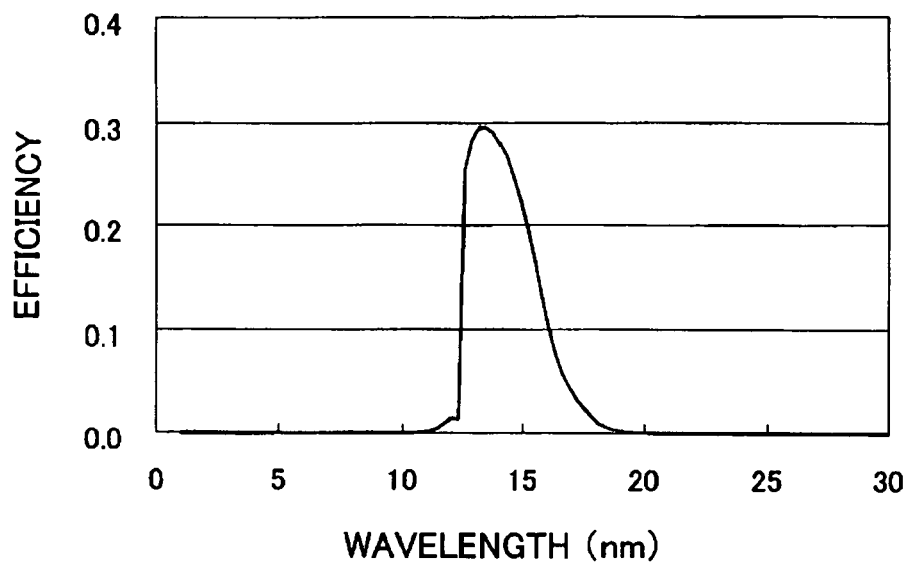
FIG. 5 is a graph of efficiency of the light that has been reflected on the condenser mirror and passed the bandpass filter shown in FIG. 3.

FIG. 5 shows efficiency of the light that has been reflected on the Mo condenser mirror 12b and transmitted the bandpass filter 72 made of Mo and Si. In FIG. 5, the ordinate axis denotes the efficiency of the light, and the abscissa axis denotes the wavelength. Referring to FIG. 5, the reflectance of the condenser mirror 12b is low to the lights in the wave range smaller than 2 nm, and these lights do not reach the calorimeter 74.

Proper selections of the condenser mirror 12b and the bandpass filter 72 would enable only the light near the exposure wavelength to pass. However, the thickness of the bandpass filter 72 is very thin, for example, about 0.3 μm thick. Therefore, the temperature rise is inevitable in the bandpass filter 72, and the infrared ray radiated from the high-temperature bandpass filter 72 is incident upon the calorimeter 74. The output of the calorimeter 74 increases by this amount. Moreover, the temperatures of the surrounding components rise and the radiations from them vary the offset, causing a measurement error. In other words, when the EUV light 12 starts an emission and stops the emission after a while, the output of the calorimeter 74 becomes 0 when a sufficient time elapses, but actually not due to the variable offset.

Figure 6:
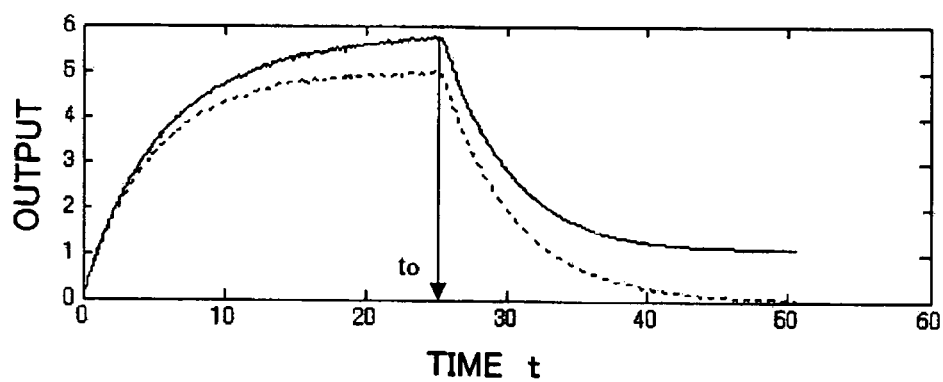
FIG. 6 is a graph showing one illustrative output of a calorimeter shown in FIG. 3.

FIG. 6 shows a simulation result of an output of the calorimeter 74 when the EUV light 12 starts an emission and stops the emission after a while. In FIG. 6, the ordinate axis denotes the output of the calorimeter 74, and the abscissa axis denotes time. As shown in FIG. 6, the EUV light source 12 starts an emission at time t=0, and EUV light source 12 stops the emission at time $t=t_0$. When only the EUV light enters the calorimeter 74, the output of the calorimeter 74 shows a broken-line graph in FIG. 6. However, actually, the infrared ray enters the calorimeter 74, and the output of the calorimeter 74 shows a solid-line graph in FIG. 6.

The operating part 78 uses the above inventive measuring method to calculate the intensity of the EUV light from the solid-line graph in FIG. 6. The operating part 78 in this embodiment calculates the intensity of the EUV light from Equation 19, and utilizes Equation 16 to determine the coefficient and to calculate the relaxation time.

Figure 7:
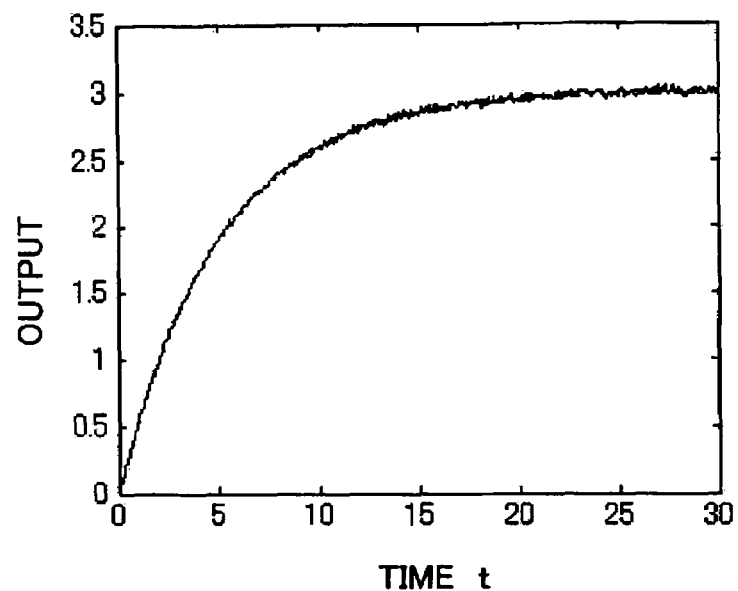
FIG. 7 is a graph showing an output of the calorimeter obtained by supplying power to a calibration heater (not shown).

FIG. 7 shows the output of the calorimeter 74 in which the power is supplied to the calibration heater (not shown) In FIG. 7, the ordinate axis denotes the output of the calorimeter 74, and the abscissa axis denotes time. The calorimeter 74 contains a measurement error of 1% ($\sigma$) since the input is given by the calibration heater, although the output does not contain influence of the infrared ray.

Figure 8:
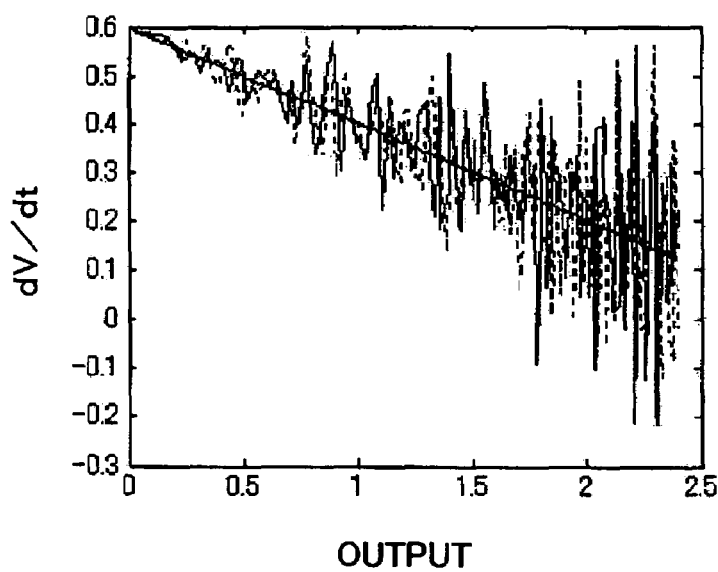
FIG. 8 is a schematic sectional view showing one exemplary structure of the calibrator shown in FIG. 2.

Assume that dV(t)/dt is a linear function of the output V(t) of the calorimeter 74. From Equation 16, the coefficient of the output V(t) of the calorimeter 74 is an inverse of the relaxation time $\tau$. FIG. 8 shows a broken-line graph, where the ordinate axis denotes the time differentiation dV(t)/dt, and the abscissa axis denotes the output. FIG. 8 also shows a solid-line approximate curve that is approximated by the linear least squares method where dV(t)/dt is set to a linear function of the output V(t) of the calorimeter 74. The linear coefficient of the approximate curve gives the relaxation time $\tau$=5.06 (seconds). When the supplied power Po is 3.0 (W), the saturation output is 3.0 (V) and C2=Po/Vo×$\tau$=5.06 (W·sec/V). The conversion coefficient A (Po/Vo) of the supplied power Po is 1 (W/V) in view of the saturation output Vo.

Referring to the solid-line graph in FIG. 6, the time differentiation to the output of the calorimeter 74 is impossible at the time at which the EUV light source 12 stops an emission. Hence, the solid-line graph in FIG. 6 is divided before and after the time at which the EUV light source 12 stops the emission, and the time differentiation of the output V is calculated as the extreme value to the time at which the EUV light source 12 stops the emission. For this purpose, the output of the calorimeter 74 is approximated by a proper function before and after the time at which the EUV light source 12 stops the emission, and the differentiated value at the time $t=t_o$ may be calculated. For example, the output before and after the time at which the EUV light source 12 stops the emission is approximated by the quadric function, and the intensity of the EUV light is calculated. First, the time differentiations of the output obtained from the function before and after the time at which the EUV light source 12 stops the emission are 0.0166 and −0.9762, respectively. The intensity of the EUV light is 5.02 (W) from C2=5.06 (W·sec/V). Since the actual intensity of the EUV light is 5 (W), an error is 0.4%.

On the other hand, the prior art regards a value of the output V of the calorimeter 74 multiplied by the conversion coefficient A as the intensity of the EUV light. The intensity of the EUV light is 5.78 (W) when the output V=5.78 (V) is multiplied by the conversion 1 (W/V) when the EUV light source 12 stops the emission. Thus, the prior art measurement error amounts to 16%.

Thus, use of the inventive measuring method would remarkably make the measurement error lower than the prior art and improve the measuring accuracy. Structurally, the calorimeter 74 is unlikely to deteriorate, and is able to be calibrated when the power is supplied to the heater properly. Thereby, it can calibrate the photodiode 50 accurately, and measure the exposure dose on the plate 40 accurately. The deterioration of the EUV light source 12 due to the long-term use is measurable, and the exchange time of the electrode 12a that generates the plasma PL and the maintenance timing of the EUV light source 12 can be predicated based on the deterioration of the EUV light source 12.

This embodiment contemplates the thin film for the bandpass filter 72 that transmits the exposure light (EUV light), but the bandpass filter 72 is not limited to the thin film. For example, as the electrode 12a that generates the plasma PL deteriorates, the temperature of the plasma PL lowers. As a result, the radiated EUV light decreases, and a ratio varies between the EUV light intensity and the non-EUV light intensity covering the long-wavelength lights such as the visible light and the infrared ray. In such a case, the bandpass filter 72 may be made of a material, such as calcium fluoride ($CaF_2$), which transmits the visible light and the infrared ray, so as to calculate the ratio. In other words, when the material of the bandpass filter 72 is changed, the light intensity of an arbitrary wavelength can be calculated.

Figure 9:
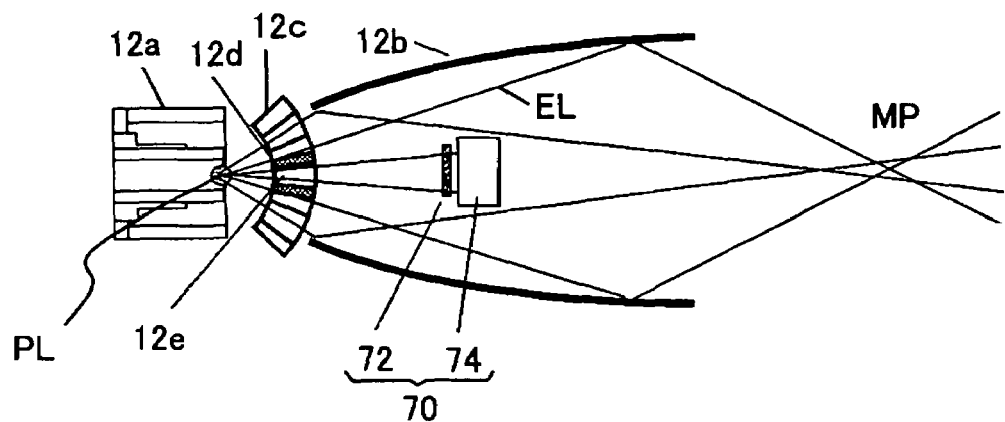
FIG. 9 is a schematic sectional view showing one exemplary structure of the calibrator shown in FIG. 2.

The calibrator 70 may be configured, as shown in FIG. 9, to always monitor the intensity of the EUV light, without shielding the EUV light introduced to the illumination optical system 14. Here, FIG. 9 is a schematic sectional view sowing one exemplary structure of the calibrator 70, although FIG. 9 omits the voltmeter 76 and operating part 78 in the calibrator 70.

Referring to FIG. 9, a debris stopper 12c is supported on a support member 12d that supports the thin plate that constitutes the debris stopper 12c. In general, the light EL that passes a position of the support member 12d is not used for exposure, and the support member 12d also serves to shield the light EL. This embodiment forms an opening 12e at the center of the support member 12d to allow the light EL to pass through it. The calorimeter 74 detects the light EL that has passed the opening 12e, and the intensity of the EUV light is measured. The bandpass filter 72 is provided in front of the calorimeter 74, and only the light having a wavelength of 13.5 nm (EUV light) is incident upon the calorimeter 74.

The support member 12d has a small effect to shield the debris, and causes the high-energy debris to pass through it. If the debris enters the calorimeter 74, the output of the calorimeter 74 increases and causes a measurement error. The bandpass filter 72 shields this debris, although the temperature rises in the bandpass filter 72.

Since the bandpass filter 72 shields the debris and the unnecessary light, the temperature rises in the bandpass filter 72 and the infrared ray enters the calorimeter. However, as described above, use of the inventive method would ensure a measurement of only the EUV light that has passed through the bandpass filter 72.

Alternatively, a multilayer coating may provide a bandpass function. The wavelength used for exposure has a range of about ±1% with respect to the center wavelength. There can be a demand to measure the intensity of the light in the wave range narrower than the bandpass filter 72 made of the thin film filter.

Figure 10:
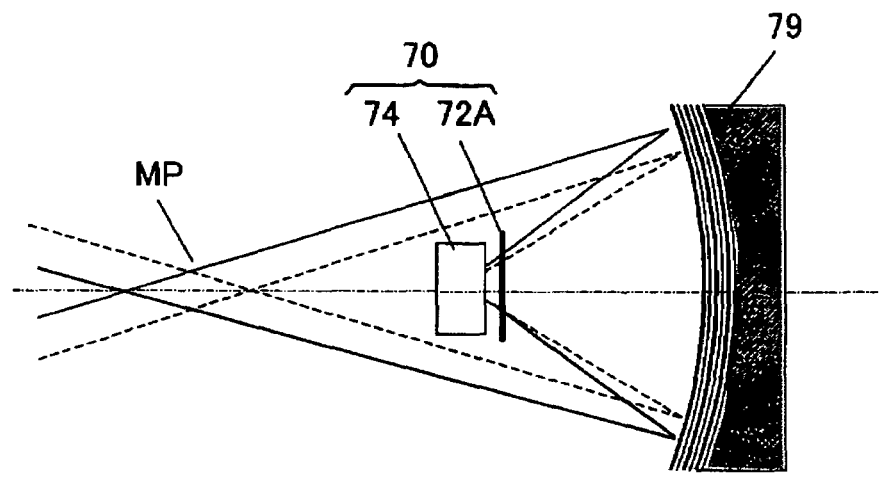
FIG. 10 is a schematic sectional view showing one exemplary structure of the calibrator shown in FIG. 2.

As shown in FIG. 10, the calorimeter 74 is arranged subsequent to the intermediate condensing point MP and on the center axis of the spherical mirror 79, and the Zr bandpass filter 72A is arranged in front of the calorimeter 74. Since the EUV light does not enter the center axis of the spherical mirror 79 which accords with the optical axis, it does not shield the exposure light. FIG. 10 is a schematic sectional view showing one exemplary structure of the calibrator 70, although FIG. 10 omits the voltmeter 76 and the operating part 78 in the calibrator 70.

The reflective surface of the spherical mirror 79 has a multilayer coating in which plural Mo layers and plural Si layers are alternately stuck. The wavelength of the light reflected on the spherical mirror 79 is extremely narrow range. In other words, the multilayer coating in the spherical mirror 79 serves as the bandpass filter. Therefore, the function that shields the visible light is enough for the bandpass filter 7A in front of the calorimeter 74; no such a bandpass function as uses a MO/Si combination is necessary.

When the calorimeter 74 is arranged on the central axis of the spherical mirror 79, the incident angle upon the spherical mirror 79 can be approximately equal for the light that is incident upon any position on the spherical mirror 79. This configuration does not require a change of a coating cycle of the multilayer coating evaporated on the spherical mirror 79 according to positions, and can maintain the uniform coating cycle and coating structure. Thereby, the EUV light reflected on any position of the spherical mirror has a spectrum with the same center wavelength.

The 0.15 μm thick Zr filter or bandpass filter 72A transmits 60% or greater of the light having a wavelength near 13.5 nm, but only 1% or smaller of the light having a wavelength of 20 nm or greater. In addition, the Zr filter has such an extremely high light-blocking effect that only 0.001% or smaller of the visible light can transmit it. The surface of the spherical mirror 79 is made of Si, and reflects the light from the visible light to the infrared ray. However, the bandpass filter 72A absorbs the lights of these wavelengths. While the temperature rises in the bandpass filter 72A and cause the infrared ray, use of the inventive measuring method would ensure the sufficient measuring accuracy.

Figure 11:
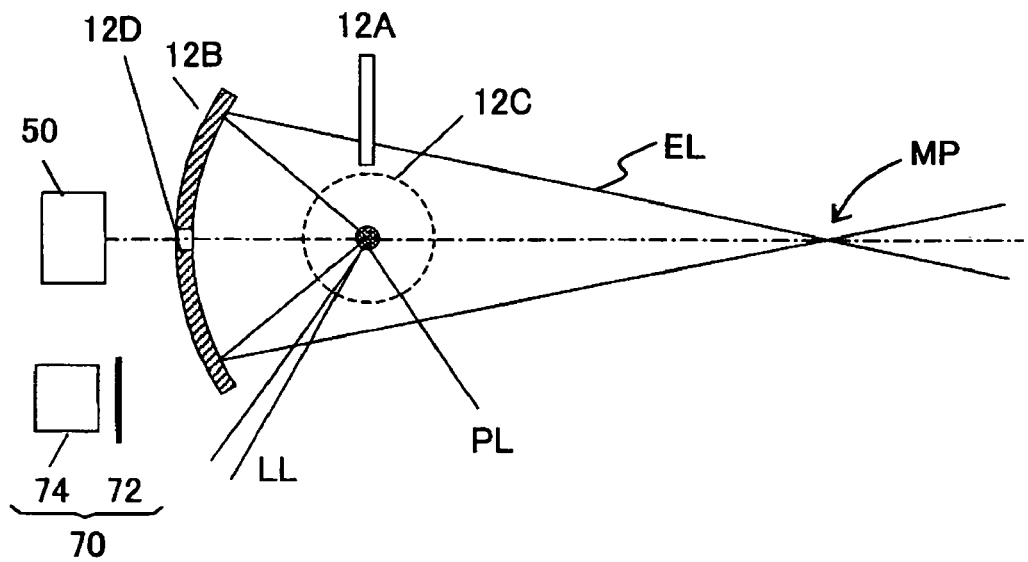
FIG. 11 is a schematic sectional view showing one exemplary structure of the calibrator shown in FIG. 2.

As shown in FIG. 11, the calibrator 70 is applicable even when the EUV light source 12 uses the laser plasma light source. Referring to FIG. 11, the laser light LL is irradiated onto a liquid xenon (Xe) drop from a nozzle 12A, and the plasma PL is generated. The light EL is radiated form the plasma PL in 4π directions, and the multilayer mirror 12B condenses it on the intermediate condensing point MP. Here, FIG. 11 is a schematic sectional view of one exemplary structure of the calibrator 70, although FIG. 11 omits the voltmeter 78 and the operating part 78 in the calibrator 70.

The debris stopper 12C serves to eliminate the debris so as to shield the debris generated from the plasma PL from the multilayer mirror 12B, and the debris stopper 12C is provided around the plasma PL. Similar to the above debris stopper 12c, gas is filled in the space formed by the parallel thin plates in the debris stopper 12C, and shields the debris while allowing the light EL to transmit it.

The multilayer mirror 12B has an opening 12D used to transmit the light EL, and the bandpass filter 72 and the calorimeter 74 (or the calibrator 70) are removably arranged subsequent to the opening 12D. Therefore, the calorimeter 74 measures the intensity of the EUV light that passes through the opening 12D and the bandpass filter 72.

As described above, the photodiode 50 deteriorates due to the EUV light and varies the sensitivity. Accordingly, the photodiode 50 is moved from the back of the opening 12D to the back of the bandpass filter 72 and the calorimeter 74. Then, the calorimeter 74 measures the intensity of the EUV light that has passed the opening 12D. Although the infrared ray is incident from the bandpass filter 72, use of the inventive measuring method would ensure the sufficient measuring accuracy. This configuration calibrates the sensitivity of the photodiode 50 by comparing the output of the photodiode 50 with the output of the calorimeter 74.

An alternative embodiment uses the present invention to evaluate the light source. In particular, this embodiment is effective to an evaluation of a light source, which measures a ratio of a specific band range longer than the UV light in the lights emitted from the light source. This evaluation utilizes the fact that the spectral sensitivity of the calorimeter is flat in the wide wave range, and measures the intensity of the light that transmits the bandpass filter in front of the calorimeter. The bandpass filter to be used differs according to the band, but Si etc. is usable for a measurement of the infrared region. The actually permissible intensity of the infrared ray is 1% or smaller of the EUV light used for exposure. When the EUV light used for exposure is 10% of the intensity of the overall wave range, only 0.1% or smaller of the infrared region is permissible in the overall wave range. Hence, the bandpass filter is used to transmit and measure the intensity of the infrared region, the bandpass filter absorbs the 99.9% of intensity in the overall wave range. Therefore, the bandpass filter radiates the infrared ray 1,000 times as high as the infrared ray from the light source to be measured. In this system, the conventional method cannot measure the infrared ray from the light source to be measured. Nevertheless, use of the inventive measuring apparatus would ensure a measurement of the intensity of the EUV light even when both the infrared ray caused by the EUV light and the infrared ray from the bandpass filter enter the calorimeter.

In exposure, the EUV light emitted from the EUV light source 12 illuminates the mask 20, and forms an image of the reticle 20's pattern onto the plate 40 via the projection optical system 30. The image plane of this embodiment is an arc-shaped or ring-shaped image plane, and the reticle and the plate 40 are scanned at a speed ratio of a reduction ratio. Thus, the entire surface of the retile 20 is exposed. The exposure apparatus 1 can precisely measure the intensity of the EUV light from the EUV light source 12 (exposure dose on the plate 40), by utilizing the diode 50 having sensitivity calibrated by the calibrator 70 (according to the inventive measuring method). Therefore, the exposure apparatus 1 can control the exposure dose and CD precisely. Thereby, the exposure apparatus 1 can provide devices (such as semiconductor devices, LCD devices, image pickup devices (such as CCDs, etc.), thin film magnetic heads, and the like) at a high throughput and economical efficiency. In addition, the calibrator 70 is usable to detect the deterioration and intensity variance of the plasma light source 12. Thereby, it is possible to recognize the maintenance time of the EUV light source 12, and to prevent use of the EUV light source 12 that should be exchanged and exchange of the EUV light source that does not have to be exchanged.

Figure 13:
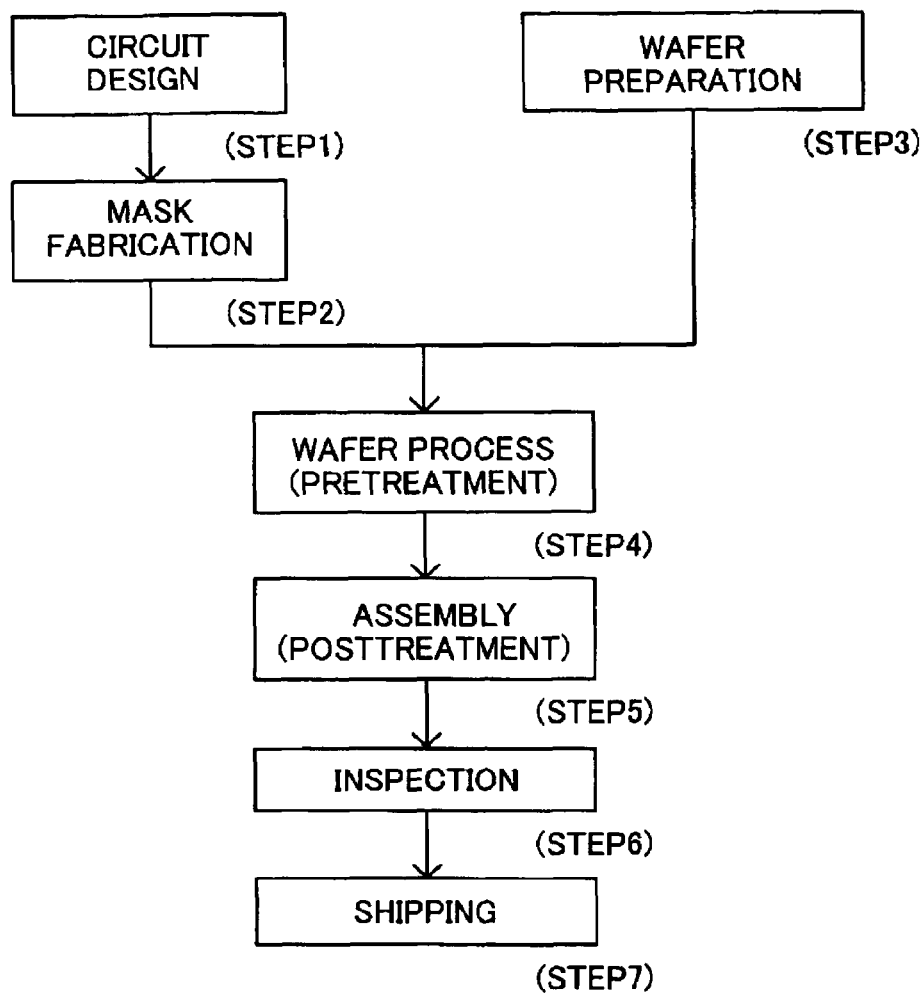
FIG. 13 is a flowchart for explaining manufacture of devices (such as semiconductor chips such as ICs and LCDs, CCDs, and the like).
Figure 14:
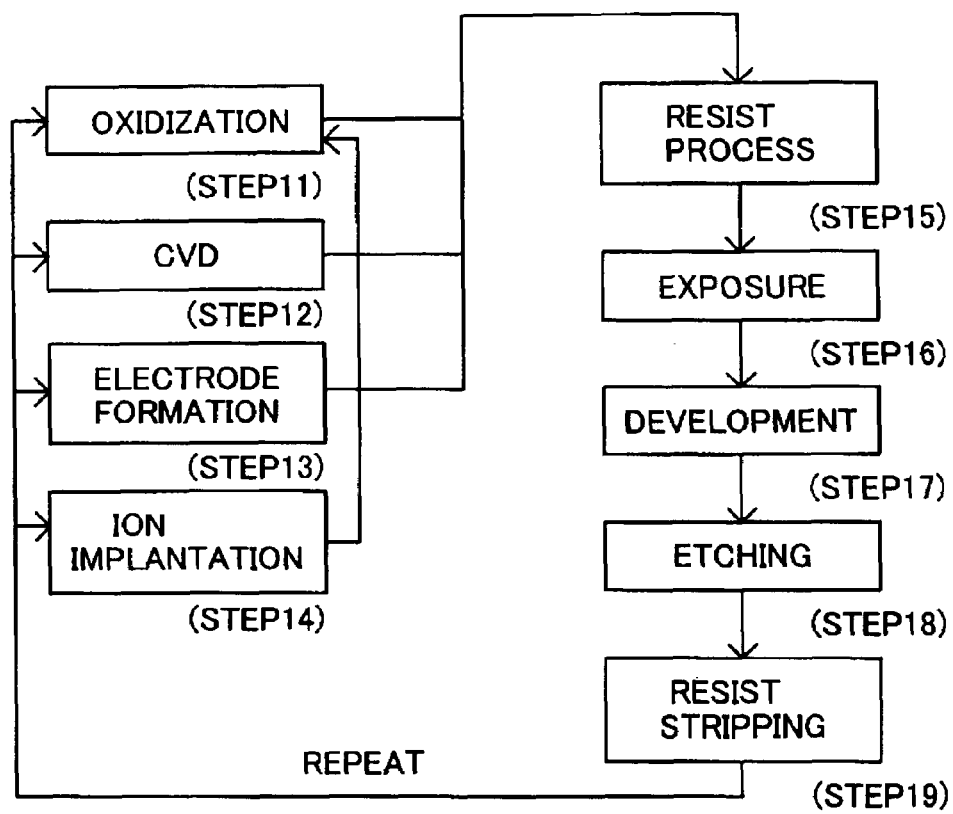
FIG. 14 is a detail flowchart of a wafer process as Step 4 shown in FIG. 13.

Referring now to FIGS. 13 and 14, a description will be given of an embodiment of a device manufacturing method using the above exposure apparatus 1. FIG. 13 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having the designed circuit pattern. Step 3 (wafer preparation) manufactures a wafer using materials such as silicon. Step 4 (wafer process), which is also referred to as a pretreatment, forms actual circuitry on the wafer through lithography using the mask and wafer. Step 5 (assembly), which is also referred to as a post treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the manufacturing method in this embodiment helps fabricate higher-quality devices than ever. The device manufacturing method that uses the exposure apparatus 1 and resultant devices constitute one aspect of the present invention.

Further, the present invention is not limited to these preferred embodiments, and various variations and modifications may be made without departing from the scope of the present invention. For example, a thin film filter, such as a Zr filter, is illustrated as a filter that cuts visual light, but the present invention is not limited to Zr. For example, the present invention is applicable to a $CaF_2$ filter that transmits the light having a wavelength longer than that of the UV light.

This application claims a foreign priority benefit based on Japanese Patent Application No. 2005-043477, filed on Feb. 21, 2005, which is hereby incorporated by reference herein in its entirety as if fully set forth herein.

What is claimed is:

1. An exposure apparatus for illuminating a pattern of a mask with light from a light source and for exposing the pattern onto a plate, said exposure apparatus comprising:
    a photodiode for measuring an exposure dose on the plate;
    a controller for controlling the exposure dose based on a measurement result of said photodiode;
    a calibrator for calibrating said photodiode;
    a bandpass filter for transmitting the light having a predetermined wavelength among lights emitted from the light source; a measurement apparatus for measuring an absolute intensity of an incident light via the bandpass filter;

a condenser mirror for condensing the light from the light source, the condenser mirror having a reflective surface with an opening that allows the light from the light source to pass through the opening; and an operating part configured to perform a measuring method that utilizes the bandpass filter and the measurement apparatus, wherein the measurement apparatus is arranged at a side opposite to the reflective surface, and at a position that ensures a detection of the light that has passed through the opening, and wherein the measuring method includes the steps of:
measuring an output of the measurement apparatus continuously;
stopping or starting an emission of the light source in the measuring step;
calculating a first extreme value $t \to t_0 - 0$ and a second extreme value $t \to t_0 + 0$ in the output of the measurement apparatus at time $t_0$ where t is time in the measuring step, and $t_0$ is time when the emission of the light source stops; and
calculating a difference between the first extreme value $t \to t_0 - 0$ and the second extreme value $t \to t_0 + 0$.

2. An exposure apparatus according to claim 1, wherein said bandpass filter and said measurement apparatus are provided in vacuum.

3. An exposure apparatus according to claim 1, wherein said bandpass filter is made of molybdenum and silicon.

4. An exposure apparatus according to claim 1, further comprising a spherical mirror arranged at an incident side of said bandpass filter, said spherical mirror having a multilayer coating that reflects the light having the predetermined wavelength.

5. An exposure apparatus according to claim 4, wherein said measurement apparatus is arranged on a central axis of said spherical mirror.

6. A device manufacturing method comprising the steps of:
exposing a plate using an exposure apparatus according to claim 1; and
developing the plate that has been exposed.

* * * * *